(12) United States Patent
Guo

(10) Patent No.: US 10,529,694 B2
(45) Date of Patent: Jan. 7, 2020

(54) METHODS AND SYSTEMS FOR WAFER BONDING ALIGNMENT COMPENSATION

(71) Applicant: Yangtze Memory Technologies Co., Ltd., Wuhan, Hubei (CN)

(72) Inventor: Shuai Guo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/046,689

(22) Filed: Jul. 26, 2018

(65) Prior Publication Data

US 2019/0355698 A1 Nov. 21, 2019

Related U.S. Application Data

(63) Continuation of application No. PCT/CN2018/087175, filed on May 16, 2018.

(51) Int. Cl.
*B81C 3/00* (2006.01)
*H01L 21/66* (2006.01)
(Continued)

(52) U.S. Cl.
CPC .......... *H01L 25/0657* (2013.01); *B81C 3/004* (2013.01); *H01L 22/20* (2013.01);
(Continued)

(58) Field of Classification Search
None
See application file for complete search history.

(56) References Cited

U.S. PATENT DOCUMENTS 6,269,322 B1 * 7/2001 Templeton ................ G03F 9/70
355/53
10,276,417 B2 4/2019 Wang et al.
(Continued)

FOREIGN PATENT DOCUMENTS

CN 103137509 A 6/2013
CN 103187349 A 7/2013
(Continued)

OTHER PUBLICATIONS

International Search Report and Written Opinion of the International Searching Authority directed to related International Patent Application No. PCT/CN2018/087175, dated Feb. 19, 2019; 9 pages.

*Primary Examiner* — Thien F Tran
(74) *Attorney, Agent, or Firm* — Sterne, Kessler, Goldstein & Fox P.L.L.C.

(57) ABSTRACT

Embodiments of methods and systems for wafer bonding alignment compensation are disclosed. The method comprises bonding a first pair of wafers including multiple bonding alignment mark pairs on the first pair of wafers; first analyzing a translational misalignment and a rotational misalignment between the first pair of wafers based on a measurement of at least two bonding alignment mark pairs; controlling a wafer position adjustment module to compensate for the translational misalignment and the rotational misalignment during bonding of a second pair of wafers based on the first analysis; second analyzing a mean run-out misalignment between the first pair of wafers based on a measurement of the multiple bonding alignment mark pairs; and controlling a wafer deformation adjustment module to compensate for the run-out misalignment during bonding of a third pair of wafers based on the second analysis.

20 Claims, 13 Drawing Sheets

(51) Int. Cl.
*H01L 25/00* (2006.01)
*H01L 23/544* (2006.01)
*H01L 25/065* (2006.01)

(52) U.S. Cl.
CPC ............ *H01L 23/544* (2013.01); *H01L 25/50* (2013.01); *H01L 2223/54426* (2013.01); *H01L 2225/06593* (2013.01)

(56) References Cited

U.S. PATENT DOCUMENTS

| | | | |
|---|---|---|---|
| 2007/0252994 A1* | 11/2007 | Bijnen | H01L 21/67092 356/401 |
| 2008/0100321 A1 | 5/2008 | Nayak et al. | |
| 2009/0251699 A1 | 10/2009 | George | |
| 2014/0356981 A1 | 2/2014 | Hubbard et al. | |
| 2015/0214082 A1* | 7/2015 | Huang | H01L 21/67092 438/14 |
| 2017/0038562 A1* | 2/2017 | Georgiev | G02B 7/003 |
| 2017/0243853 A1 | 8/2017 | Huang et al. | |
| 2019/0088516 A1 | 3/2019 | Zhu et al. | |

FOREIGN PATENT DOCUMENTS

| | | | |
|---|---|---|---|
| CN | 105655277 A | 6/2016 | |
| CN | 106158715 A | 11/2016 | |
| CN | 106229283 A | 12/2016 | |
| CN | 108598032 A | 9/2018 | |
| CN | 206992074 U | 9/2018 | |
| JP | 2015/050398 A | 3/2015 | |
| TW | 2012/43979 A1 | 11/2012 | |
| TW | 2017/42171 A | 12/2017 | |
| WO | WO-2012/126752 A1 | 9/2012 | |

* cited by examiner

METHODS AND SYSTEMS FOR WAFER BONDING ALIGNMENT COMPENSATION

CROSS-REFERENCE TO RELATED APPLICATIONS

This application claims priority to PCT/CN2018/087175 filed on May 16, 2018, the entire contents of which are incorporated herein by reference.

TECHNICAL FIELD

The present disclosure generally relates to the field of semiconductor technology, and more particularly, to methods and systems for wafer bonding alignment compensation.

BACKGROUND

Semiconductor chips are integrated to more complicated functionalities and scaled to smaller sizes by improving process technology, circuit design, programming algorithm, and fabrication process. The importance of wafer bonding techniques has been realized in the development of multi-layered micro/nano electromechanical systems (MEMS/NEMS) and three-dimensional integrated circuits (3D ICs) integration aiming at creating more compact and complex systems with improved functionality. This enables semiconductor devices to be fabricated separately and then bonded together, which provides more freedom in design and allows more advanced semiconductor systems to be fabricated.

But as feature sizes of the line widths approach a lower limit and the shrinkage of electromechanical systems into the nanometer range, the lack of effective techniques for achieving bonding alignment with submicron precision has become a critical stumbling block. There is a need for more accurate bonding alignment to achieve higher device integration.

BRIEF SUMMARY

Embodiments of methods and systems for wafer bonding alignment compensation are disclosed herein.

Disclosed is a method for wafer bonding alignment compensation. The method comprises bonding a first pair of wafers including a plurality of bonding alignment mark pairs on the first pair of wafers, wherein each wafer has a corresponding bonding alignment mark from each of the plurality of bonding alignment mark pairs; first analyzing a translational misalignment and a rotational misalignment between the first pair of wafers based on a measurement of at least two bonding alignment mark pairs; controlling a wafer position adjustment module to compensate for the translational misalignment and the rotational misalignment during bonding of a second pair of wafers based on the first analysis; second analyzing a mean run-out misalignment between the first pair of wafers based on a measurement of the plurality of bonding alignment mark pairs; and controlling a wafer deformation adjustment module to compensate for the run-out misalignment during bonding of a third pair of wafers based on the second analysis.

In some embodiments, the method further comprises: determining whether the translational misalignment and the rotational misalignment are within an allowable error range; and in response to determining that the translational misalignment and the rotational misalignment are outside the allowable error range, controlling the wafer position adjustment module to compensate the translational misalignment and the rotational misalignment during bonding of the second pair of wafers.

In some embodiments, the method further comprises: determining whether the run-out misalignment is within an allowable error range; and in response to determining that the run-out misalignment is outside the allowable error range, controlling the wafer deformation adjustment module to compensate the run-out misalignment during bonding of the third pair of wafers.

In some embodiments, the first pair of wafers including a bottom wafer and a top wafer; and each bonding alignment mark pair includes a bottom bonding alignment mark on the bottom wafer and a top bonding alignment mark on the top wafer.

In some embodiments, first analyzing the translational misalignment and the rotational misalignment between the first pair of wafers comprises: calculating a first misalignment between a first bonding alignment mark pair in a first direction; calculating a second misalignment between the first bonding alignment mark pair in a second direction; and calculating a third misalignment between a second bonding alignment mark pair in the second direction.

In some embodiments, calculating the first misalignment between the first bonding alignment mark pair in the first direction comprises: determining a first distance between a center of the top wafer and a center of the bottom wafer in the first direction; determining a second distance between the bottom bonding alignment mark of the first bonding alignment mark pair and the center of bottom wafer; determining an angle between the first direction and a connection line of the bottom bonding alignment mark of the first bonding alignment mark pair and the center of bottom wafer; and calculating the first misalignment between the first bonding alignment mark pair in the first direction based on the first distance, the second distance, and the angle.

In some embodiments, calculating the second misalignment between the first bonding alignment mark pair in the second direction comprises: determining a first distance between a center of the top wafer and a center of the bottom wafer in the second direction; determining a second distance between the bottom bonding alignment mark of the first bonding alignment mark pair and the center of bottom wafer; determining an angle between the first direction and a connection line of the bottom bonding alignment mark of the first bonding alignment mark pair and the center of bottom wafer; and calculating the second misalignment between the first bonding alignment mark pair in the second direction based on the first distance, the second distance, and the angle.

In some embodiments, calculating the third misalignment between the second bonding alignment mark pair in the second direction comprises: determining a first distance between a center of the top wafer and a center of the bottom wafer in the second direction; determining a second distance between the bottom bonding alignment mark of the second bonding alignment mark pair and the center of bottom wafer; determining an angle between the first direction and a connection line of the bottom bonding alignment mark of the second bonding alignment mark pair and the center of bottom wafer; and calculating the third misalignment between the second bonding alignment mark pair in the second direction based on the first distance, the second distance, and the angle.

In some embodiments, controlling the wafer position adjustment module to compensate for translational misalignment and the rotational misalignment during bonding of the second pair of wafers based on the first analysis comprises: adjusting a position of at least one of the second pair of wafers based on the first misalignment, the second misalignment, and the third misalignment.

In some embodiments, second analyzing the mean run-out misalignment between the first pair of wafers comprises: calculating a run-out misalignment between each bonding alignment mark pair; and calculating an average of the run-out misalignments corresponding to the plurality of bonding alignment mark pairs as the mean run-out misalignment between the pair of wafers.

In some embodiments, calculating the run-out misalignment between each bonding alignment mark pair comprises: determining a first distance between a center of the top wafer and a top bonding alignment mark in a bonding alignment mark pair; determining a second distance between the top bonding alignment mark and a bottom bonding alignment mark in the bonding alignment mark pair; determining an angle between a connection line of the bonding alignment mark pair and a radiation direction of the top bonding alignment mark on the top wafer; and calculating the run-out misalignment between the bonding alignment mark pair based on the first distance, the second distance, and the angle.

In some embodiments, controlling the wafer deformation adjustment module to compensate the run-out misalignment during bonding of the third pair of wafers based on the second analysis comprises: adjusting a deformation of at least one of the third pair of wafers based on the mean run-out misalignment.

Another aspect of the present disclosure provides a system for bonding wafers.

The system comprises: a wafer support module configured to support a first pair of wafers including a plurality of bonding alignment mark pairs, wherein the first pair of wafers including a bottom wafer and a top wafer, and each bonding alignment mark pair includes a bottom bonding alignment mark on the bottom wafer and a top bonding alignment mark on the top wafer; an alignment monitoring module configured to measure positions of the plurality of bonding alignment mark pairs; a hardware processor configured to analyze a translational misalignment and a rotational misalignment between the first pair of wafers based on a measurement of at least two bonding alignment mark pairs, and to analyze a mean run-out misalignment between the first pair of wafers based on a measurement of the plurality of bonding alignment mark pairs; a wafer position adjustment module configured to compensate the translational misalignment and the rotational misalignment during bonding of a second pair of wafers; and a wafer deformation adjustment module configured to compensate the mean run-out misalignment during bonding of a third pair of wafers.

In some embodiments, the hardware processor further is configured to: determine whether the translational misalignment and the rotational misalignment are within an allowable error range; and in response to determining that the translational misalignment and the rotational misalignment are outside the allowable error range, control the wafer position adjustment module to compensate the translational misalignment and the rotational misalignment during bonding the second pair of wafers.

In some embodiments, the hardware processor further is configured to: determine whether the run-out misalignment is within an allowable error range; and in response to determining that the run-out misalignment is outside the allowable error range, control the wafer deformation adjustment module to compensate the run-out misalignment during bonding of the third pair of wafers.

In some embodiments, the hardware processor further is configured to: calculate a first misalignment between a first bonding alignment mark pair in a first direction; calculate a second misalignment between the first bonding alignment mark pair in a second direction; and calculate a third misalignment between a second bonding alignment mark pair in the second direction.

In some embodiments, the hardware processor further is configured to: determine a first distance between a center of the top wafer and a center of the bottom wafer in the first direction; determine a second distance between the bottom bonding alignment mark of the first bonding alignment mark pair and the center of bottom wafer; determine an angle between the first direction and a connection line of the bottom bonding alignment mark of the first bonding alignment mark pair and the center of bottom wafer; and calculate the first misalignment between the first bonding alignment mark pair in the first direction based on the first distance, the second distance, and the angle.

In some embodiments, the hardware processor further is configured to: determine a first distance between a center of the top wafer and a center of the bottom wafer in the second direction; determine a second distance between the bottom bonding alignment mark of the first bonding alignment mark pair and the center of bottom wafer; determine an angle between the first direction and a connection line of the bottom bonding alignment mark of the first bonding alignment mark pair and the center of bottom wafer; and calculate the second misalignment between the first bonding alignment mark pair in the second direction based on the first distance, the second distance, and the angle.

In some embodiments, the hardware processor further is configured to: determine a first distance between a center of the top wafer and a center of the bottom wafer in the second direction; determine a second distance between the bottom bonding alignment mark of the second bonding alignment mark pair and the center of bottom wafer; determine an angle between the first direction and a connection line of the bottom bonding alignment mark of the second bonding alignment mark pair and the center of bottom wafer; and calculate the third misalignment between the second bonding alignment mark pair in the second direction based on the first distance, the second distance, and the angle.

In some embodiments, the hardware processor further is configured to: control the wafer position adjustment module to adjust a position of at least one of the second pair of wafers based on the first misalignment, second misalignment, and the third misalignment.

In some embodiments, the hardware processor further is configured to: calculate a run-out misalignment between each bonding alignment mark pair; and calculate an average of the run-out misalignments corresponding to the plurality of bonding alignment mark pairs as the mean run-out misalignment between the pair of wafers.

In some embodiments, the hardware processor further is configured to: determine a first distance between a center of the top wafer and a top bonding alignment mark in a bonding alignment mark pair; determine a second distance between the top bonding alignment mark and a bottom bonding alignment mark in the bonding alignment mark pair; determine an angle between a connection line of the bonding alignment mark pair and a radiation direction of the top bonding alignment mark on the top wafer; and calculate the run-out misalignment between the bonding alignment mark pair based on the first distance, the second distance, and the angle.

In some embodiments, the hardware processor further is configured to: control the wafer deformation adjustment module to adjust a deformation of at least one of the third pair of wafers based on the mean run-out misalignment.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
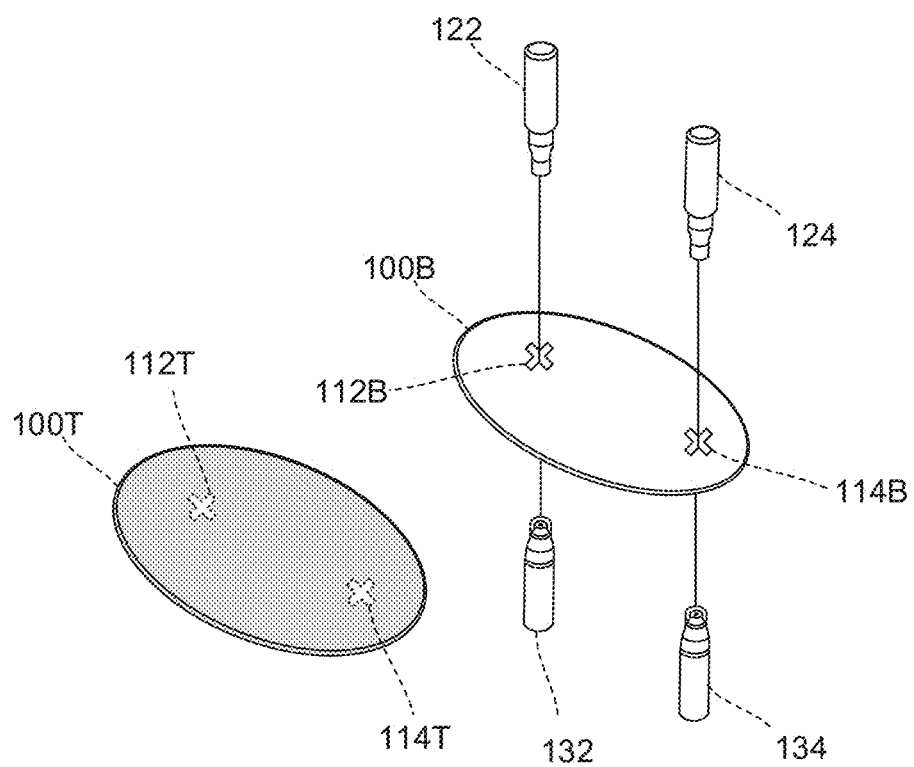
FIGS. 1A-1D illustrate schematic diagrams of an exemplary wafer bonding system in certain stages to bond a pair of wafers in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within. For example, 10-30% of the value (e.g., ±10%, ±20%, or ±30% of the value).

In accordance with some embodiments of the present disclosure, methods and systems for wafer bonding alignment compensation are disclosed. The disclosed methods and systems can compensate the translational misalignment, the rotational misalignment and the run-out misalignment (e.g., expansion misalignment) during bonding wafer pairs, thereby improving the alignment accuracy, reducing the size of the devices, and increasing the product yield.

Optical alignment is a commonly used method to achieve wafer bonding alignment. By positioning one wafer with respect to another and aligning the two wafers using bonding alignment marks observed through optical objectives, the alignment between the pair of wafers can be achieved. FIGS. 1A-1D illustrate schematic diagrams of an exemplary wafer bonding system in certain stages to bond a pair of wafers in accordance with some embodiments of the present disclosure.

In some embodiments, a wafer bonding system can include a first stage (not shown in figures) having a first aperture, and a second stage (not shown in figures) having a second aperture. A first chuck (not shown in figures) can be mounted on or attached to the first aperture of the first stage, and a second chuck (not shown in figures) can be mounted on or attached to the second aperture of the second stage. The first stage and the first chuck are also referred to herein collectively as a first support, and the second stage and the second chuck are also referred to herein collectively as a second support. The first chuck can be adapted to support a first wafer, and the second chuck is configured to support a second wafer. As shown in FIG. 1A, the first wafer is also referred to herein as a bottom wafer 100B, and the second wafer is also referred to herein as a top wafer 100T.

In some embodiments, the first chuck and the second chuck can be substantially transparent. For example, the first chuck and the second chuck may comprise glass, quartz, or other type of transparent material. In other embodiments, the first chuck and the second chuck may comprise a translucent or opaque material. In yet other embodiments, the first chuck is substantially transparent, and the second chuck is translucent or opaque, or vice versa. In embodiments where at least the first chuck includes a substantially transparent material, the alignment of the wafers and is improved due to increased visibility of bonding alignment marks (e.g., 112B, 114B, 112T, 114T as shown in FIG. 1A) on the wafers 100B and 100T.

The wafer bonding system can further include an alignment monitoring module. In some embodiments, the alignment monitoring module can include any suitable optical equipment for monitoring bonding alignment marks on the bottom wafer 100B and/or the top wafer 100T, and detecting the positions of the bonding alignment marks. For example, the alignment monitoring module can include one or more infrared (IR) charge coupled device (CCD) scopes comprising an IR live CCD configured to emit reflective infrared (RIR) or transparent infrared (TIR) energy. In some embodiments, the alignment monitoring module can further include any suitable optical equipment for positioning the bonding alignment marks, such as a linear variable differential transformer (LVDT), a laser interferometer, or an optical linear encoder and decoder, etc.

In some embodiments, as shown in FIG. 1A, the alignment monitoring module includes at least two top scopes 122 and 124 that are disposed proximate the first chuck and two bottom scopes 132 and 134 that are disposed proximate the second chuck. The position of top scope 122 can correspond to the position of bottom scope 132, and the position of top scope 124 can correspond to the position of bottom scope 134. The top scope 122 and the bottom scope 132 can be referred to a first scope pair, and the top scope 124 and the bottom scope 134 can be referred to a second scope pair. In some embodiments, before loading a wafer, each scope pair can be aligned with each other. As such, after loading a wafer, a bonding alignment mark on the wafer that is aligned with the scope pair can be positioned with a specific coordinate.

The wafer bonding system can further include a wafer position adjustment module (not shown in figures) for adjusting the positions of the first and second supports. In some embodiments, the wafer position adjustment module can include any suitable equipment coupled with the first support and/or the second support for adjusting the positions of the first support and/or the second support, such as a piezoelectric motor, a linear motor, etc. The wafer position adjustment module can be configured to adjust linear positions (e.g., x-coordinate position, y-coordinate position, and z-coordinate position), and/or an angular position of the bottom wafer 100B and/or the top wafer 100T by controlling the movement of the first support and/or the second support.

Figure 1B:
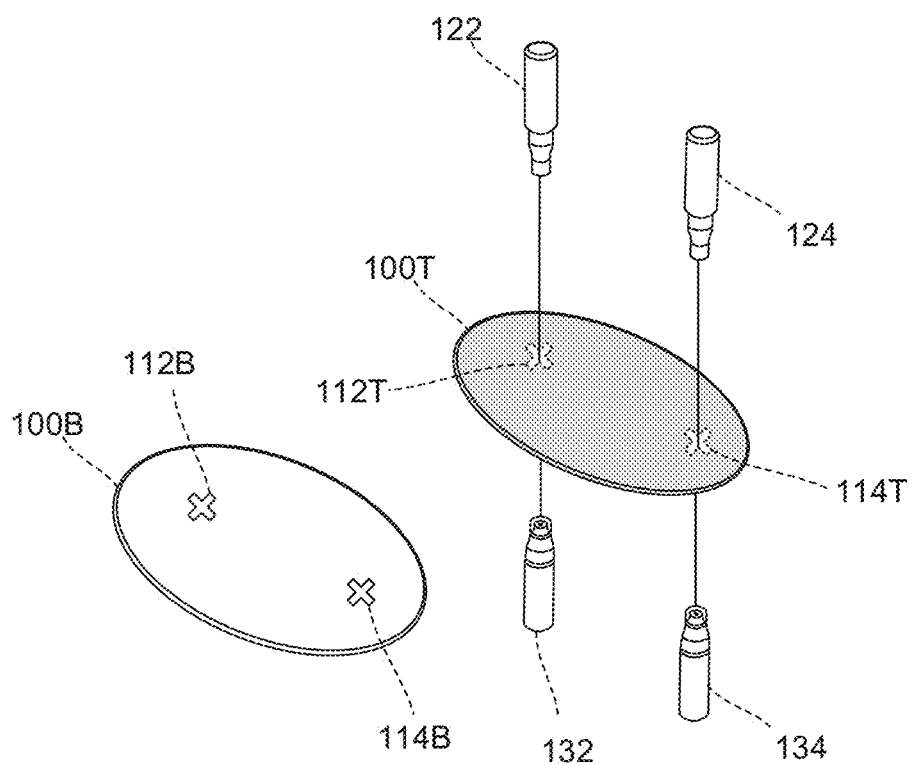
Figure 1C:
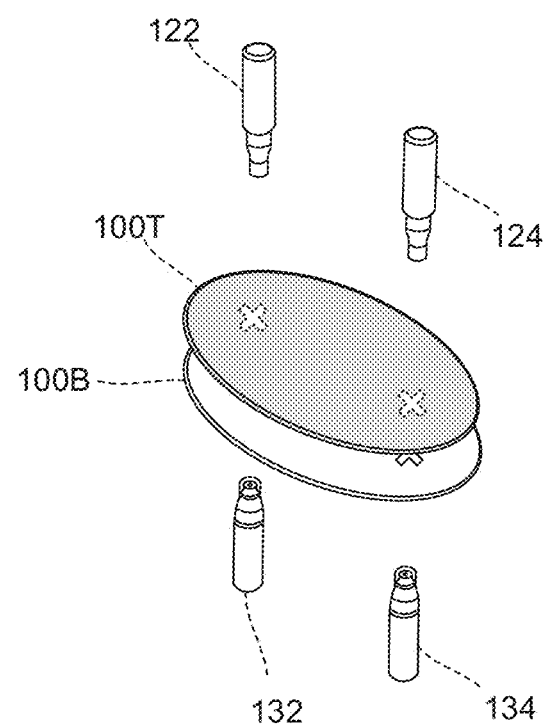
Figure 1D:
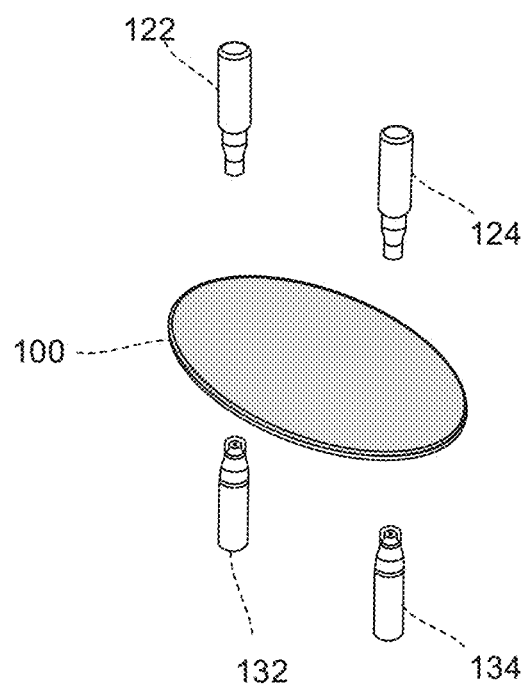

In some embodiments, a process for aligning a top wafer and a bottom wafer can include the following steps. As shown in FIG. 1A, the wafer position adjustment module can control the position of the first support that carries the bottom wafer 100B, such that a first bottom bonding alignment mark 112B on the bottom wafer 100B can be aligned with the first bottom scope 132, and a second bottom bonding alignment mark 114B on the bottom wafer 100B can be aligned with the second bottom scope 134. After the alignment, the position of the first support can be recorded, and then the wafer position adjustment module can control the first support to move the bottom wafer away from the recorded position. Referring to FIG. 1B, the wafer position adjustment module can control the position of the second support that carries the top wafer 100T, such that a first top bonding alignment mark 112T on the top wafer 100T can be aligned with the first top scope 122, and a second top bonding alignment mark 114T on the top wafer 100T can be aligned with the second top scope 124. Referring to FIG. 1C, the wafer position adjustment module can control the first support to retune to the recorded position. As such, the first bottom bonding alignment mark 112B and the first top bonding alignment mark 112T can be aligned with each other, and the second bottom bonding alignment mark 114B and the second top bonding alignment mark 114T can be aligned with each other. It is noted that, each pair of bottom bonding alignment mark and top bonding alignment mark is also referred to herein as a bonding alignment mark pair. By aligning two bonding alignment mark pairs, the bottom wafer 100B and the top wafer 100T can be aligned with each other. Referring to FIG. 1D, after the alignment process, the bottom wafer 100B and the top wafer 100T can be bonded to form a bonded wafer pair 100 by using any suitable bonding method.

Figure 2:
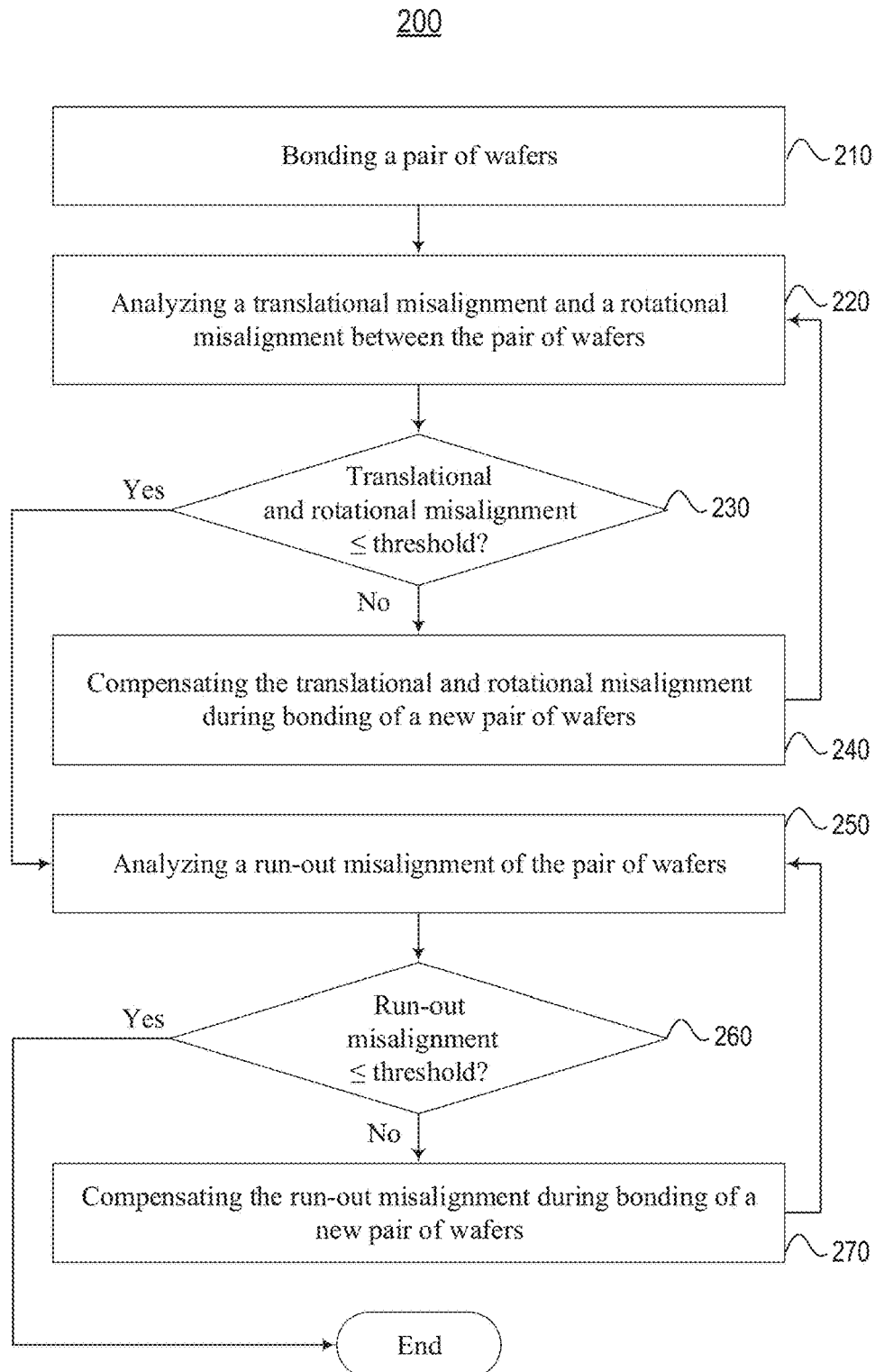
FIG. 2 illustrates a flow diagram of an exemplary method for wafer bonding alignment compensation, according to some embodiments of the present disclosure.

FIG. 2 illustrates a flow diagram of an exemplary method 200 for wafer bonding alignment compensation in accordance with some embodiments of the present disclosure. As shown in FIG. 2, the method 200 starts at operation 210, in which a pair of wafers can be bonded. In some embodiments, the pair of wafers can include a bottom wafer and a top wafer, and can be bonded by performing the bonding process described above in connection with FIGS. 1A-1D.

After bonding the pair of wafers, the method 200 processes to operation 220, in which a translational misalignment and a rotational misalignment between the pair of wafers can be analyzed. Since the bonding process can be performed in a fixed plane (e.g., a x-y plane with a fixed z-coordinate), the translational misalignment of a wafer can be represented by a two-dimensional linear displacement (e.g., a x-coordinate misalignment and a y-coordinate misalignment) of the center of the wafer in the fixed plane, and the rotational misalignment can be represented by a one-dimensional angular displacement (e.g., a polar-coordinate misalignment) of the of the center of the wafer in the fixed plane.

Figure 3:
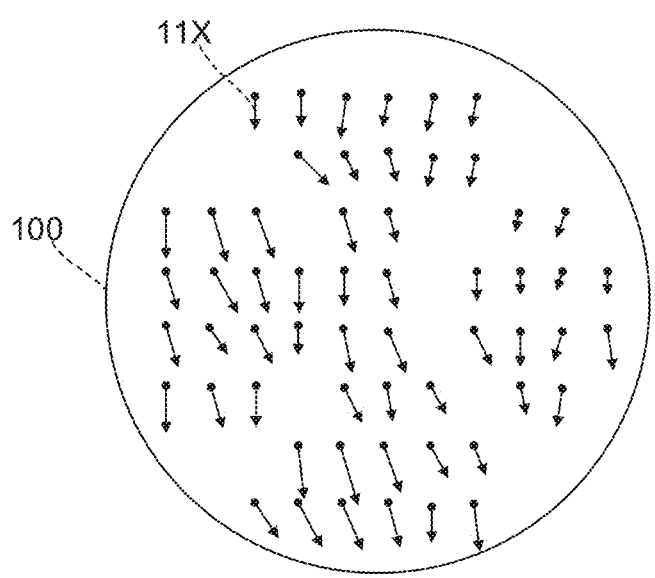
FIG. 3 illustrates a top view of an exemplary wafer misalignment including translational misalignment and rotational misalignment, according to some embodiments of the present disclosure.

FIG. 3 illustrates a top view of an exemplary wafer misalignment including translational misalignment and/or rotational misalignment. In some embodiments, the pair of wafers can include a plurality of bonding alignment mark pairs. Each bonding alignment mark pairs can include a bottom bonding alignment mark on the bottom wafer and a top bonding alignment mark on the top wafer. When the bottom wafer and the top wafer are bonded together, the misalignment between the bottom bonding alignment mark and the top bonding alignment mark of each bonding alignment mark pair can be used to measure the misalignment between the bottom wafer and the top wafer. As shown in FIG. 3, the misalignment 11X of each pair of bonding alignment marks on the bonded wafer pair 100 is indicated by a dot representing a location of one bonding alignment mark and an arrow representing a displacement between the location of one bonding alignment mark and a location of the corresponding bonding alignment mark in the mark.

Figure 4:
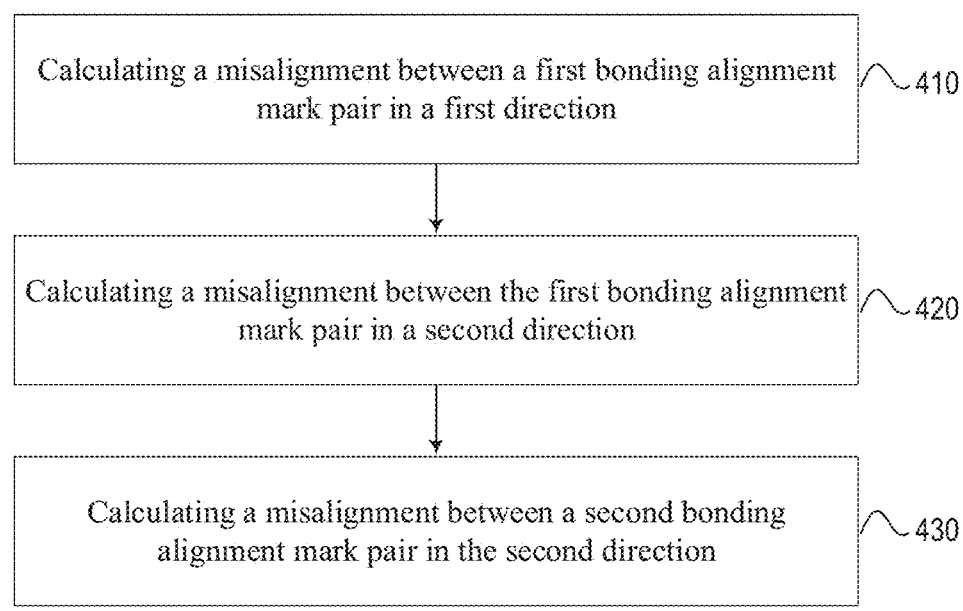
FIG. 4 illustrates a flow diagram of an exemplary method for analyzing translational misalignment and rotational misalignment of bonding alignment mark pairs, according to some embodiments of the present disclosure.
Figure 5A:
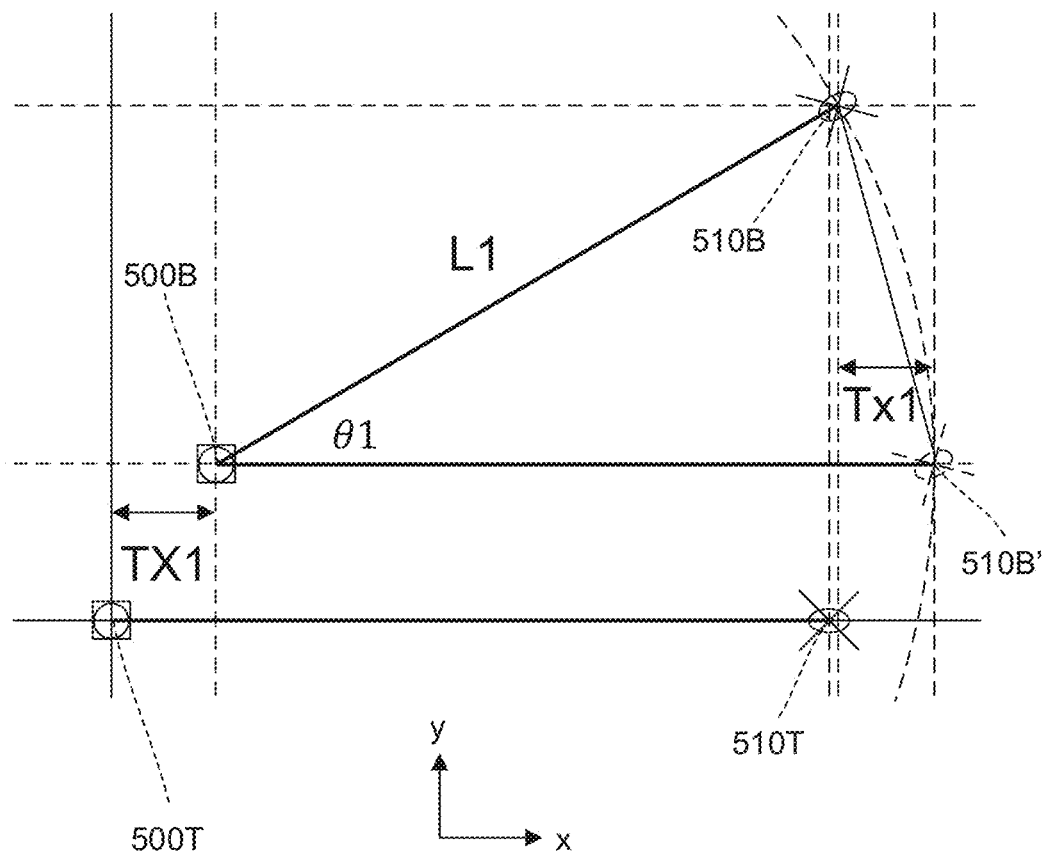
FIGS. 5A-5C illustrate schematic diagrams of exemplary bonding alignment mark analyses for translational misalignment and rotational misalignment, according to some embodiments of the present disclosure.
Figure 5B:
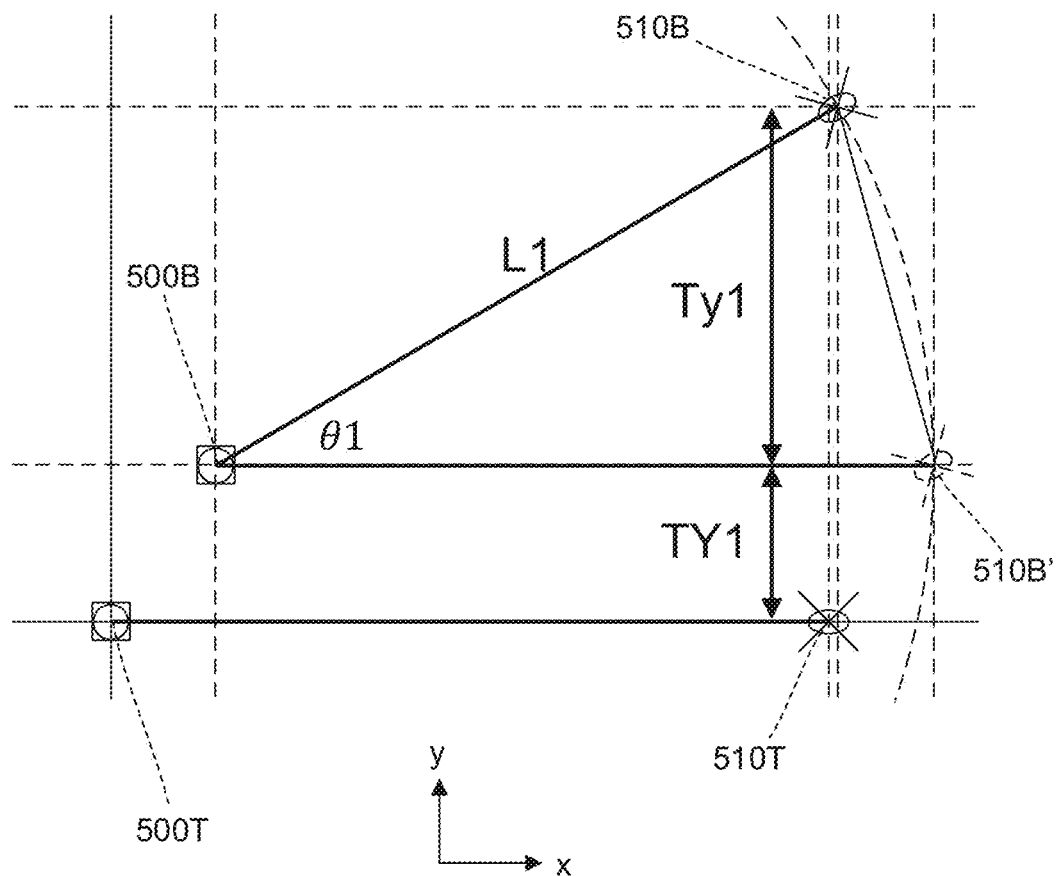
Figure 5C:
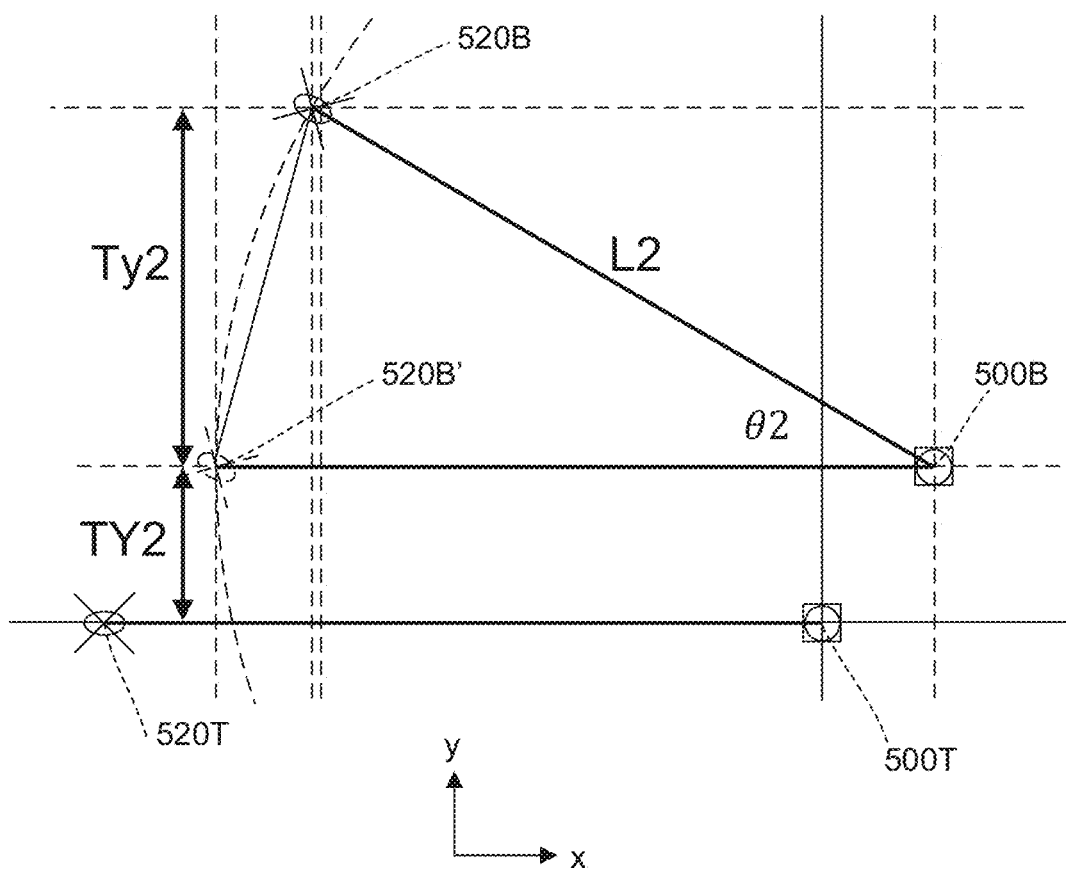

In some embodiments, the misalignments 11X of at least two pairs of bonding alignment marks can be measured to calculate the translational misalignment and the rotational misalignment between the pair of wafers. FIG. 4 illustrates schematic flow diagram of an exemplary method for analyzing translational misalignment and rotational misalignment of bonding alignment mark pairs in accordance with some embodiments of the present disclosure. FIGS. 5A-5C illustrate schematic diagrams of exemplary bonding alignment mark analyses for translational misalignment and rotational misalignment in accordance with some embodiments of the present disclosure.

As described above, in some embodiments, the translational misalignment between a pair of wafers can be represented by a two-dimensional linear displacement in an x-y plane, and the rotational misalignment between the pair of wafers can be represented by a one-dimensional angular displacement in the x-y plane. In some embodiments, the two-dimensional translational displacement and the one-dimensional angular displacement can be calculated based on a first translational misalignment between a first bonding alignment mark pair and a second translational misalignment between a second bonding alignment mark pair.

As shown in FIG. 4, the operation 220 of analyzing the translational misalignment and the rotational misalignment between the pair of wafers can include an operation 410, in which a misalignment between a first bonding alignment mark pair in a first direction can be calculated. In some embodiments, referring to FIG. 5A, 500T is the center of the top wafer, and 500B is the center of the bottom wafer. The first bonding alignment mark pair 510T and MOB can correspond to the first scope pair 122 and 132 as shown in FIGS. 1A-1D. The first direction (e.g., x-direction as shown in FIG. 5A) can be the direction from the center of top wafer 500T to the top bonding alignment mark 510T.

In some embodiments, the misalignment $\Delta X1$ between the first bonding alignment mark pair 510T and 510B in the first direction (e.g., x-direction) can be calculated based on a distance TX1 between the center of the top wafer 500T and the center of the bottom wafer 500B in the first direction (e.g., x-direction), a distance L1 between the bottom bonding alignment mark 510B and the center of bottom wafer 500B, and an angle $\theta 1$ between the first direction (e.g., x-direction) and a connection line of the bottom bonding alignment mark 510B and the center of bottom wafer 500B.

In some embodiments, the displacement of one wafer along the direction (e.g., y-direction) perpendicular to the first direction (e.g., x-direction) can be used to compensate the rotational misalignment. As shown in FIG. 5A, assuming the bottom wafer is rotated around the center of the bottom wafer 500B for an angle $\theta 1$, the bottom bonding alignment mark 510B can be moved to the position 510B', a distance Tx1 between the original position 510B and the new position 510B' of the bottom bonding alignment mark in the first direction (e.g., x-direction) is approximately equal to $L1 \times Sin\ \theta 1 \times Tan\ \theta 1$. That is, the misalignment $\Delta X1$ between the first bonding alignment mark pair 510T and 510B in the first direction (e.g., x-direction) can be the difference between the distance TX1 and the distance Tx1. That is, $\Delta X1 = TX1 - L1 \times Sin\ \theta 1 \times Tan\ \theta 1$.

Referring back to FIG. 4, the operation 220 can further include an operation 420, in which a misalignment between the first bonding alignment mark pair in a second direction can be calculated. Referring to FIG. 5B, similarly, 500T is the center of the top wafer, and 500B is the center of the bottom wafer. The first bonding alignment mark pair 510T and 510B can correspond to the first scope pair 122 and 132 as shown in FIGS. 1A-1D. The first direction (e.g., x-direction as shown in FIG. 5B) is the direction from the center of top wafer 500T to the top bonding alignment mark 510T, and the second direction (e.g., y-direction as shown in FIG. 5B) is perpendicular to the first direction.

In some embodiments, the misalignment $\Delta Y1$ between the first bonding alignment mark pair 510T and 510B in the second direction (e.g., y-direction) can be calculated based on a distance TY1 between the center of the top wafer 500T and the center of the bottom wafer 500B in the second direction (e.g., y-direction), the distance L1 between the bottom bonding alignment mark 510B and the center of bottom wafer 500B, and the angle $\theta 1$ between the first direction (e.g., x-direction) and a connection line of the bottom bonding alignment mark 510B and the center of bottom wafer 500B.

As described above, the displacement of one wafer along the direction (e.g., y-direction) perpendicular to the first direction (e.g., x-direction) can be used to compensate the rotational misalignment. As shown in FIG. 5B, assuming the bottom wafer is rotated around the center of the bottom wafer 500B for an angle $\theta 1$, the bottom bonding alignment mark 510B can be moved to the position 510B', a distance Ty1 between the original position 510B and the new position 510B' of the bottom bonding alignment mark in the second direction (e.g., y-direction) is approximately equal to $L1 \times Sin\ \theta 1 \times Tan\ \theta 1$. That is, the misalignment $\Delta Y1$ between the first bonding alignment mark pair 510T and 510B in the second direction (e.g., y-direction) can be the summation of the distance TY1 and the distance Ty1. That is, $\Delta Y1 = TY1 + L1 \times Sin\ \theta 1$.

Referring back to FIG. 4, the operation 220 can further include an operation 430, in which a misalignment between a second bonding alignment mark pair in the second direction can be calculated. Referring to FIG. 5C, similarly, 500T is the center of the top wafer, and 500B is the center of the bottom wafer. The second bonding alignment mark pair 520T and 520B can correspond to the second scope pair 124 and 134 as shown in FIGS. 1A-1D.

The top bonding alignment mark 520T in the second bonding alignment mark pair, the top bonding alignment mark 510T in the first bonding alignment mark pair as shown in FIGS. 5A and 5B, and the center of the top wafer 500T can be connected with a straight line. Since the first direction (e.g., x-direction) is defined as the direction from the center of top wafer 500T to the top bonding alignment mark 510T in the first bonding alignment mark pair as shown in FIGS. 5A and 5B, the first direction is the direction from the top bonding alignment mark 520T in the second bonding alignment mark pair to the center of top wafer 500T (e.g., x-direction as shown in FIG. 5C), and the second direction (e.g., y-direction as shown in FIG. 5C) is perpendicular to the first direction. As such, the misalignment $\Delta X2$ between the second bonding alignment mark pair 520T and 520B in the first direction (e.g., x-direction) is equal to the misalignment ΔX1 between the first bonding alignment mark pair 510T and 510B in the first direction (e.g., x-direction).

In some embodiments, the misalignment ΔY2 between the second bonding alignment mark pair 520T and 520B in the second direction (e.g., y-direction) can be calculated based on a distance TY2 between the center of the top wafer 500T and the center of the bottom wafer 500B in the second direction (e.g., y-direction), the distance L2 between the bottom bonding alignment mark 520B and the center of bottom wafer 500B, and the angle θ2 between the first direction (e.g., x-direction) and a connection line of the bottom bonding alignment mark 520B and the center of bottom wafer 500B.

As described above, the displacement of one wafer along the direction (e.g., y-direction) perpendicular to the first direction (e.g., x-direction) can be used to compensate the rotational misalignment. As shown in FIG. 5C, assuming the bottom wafer is rotated around the center of the bottom wafer 500B for an angle θ2, the bottom bonding alignment mark 520B can be moved to the position 520B', a distance Ty2 between the original position 520B and the new position 520B' of the bottom bonding alignment mark in the second direction (e.g., y-direction) is approximately equal to L2×Sin θ2. That is, the misalignment ΔY2 between the second bonding alignment mark pair 520T and 520B in the second direction (e.g., y-direction) can be the summation of the distance TY2 and the distance Ty2. That is, ΔY2=TY2+L2×Sin θ2.

Referring back to FIG. 2, after analyzing the translational misalignment and the rotational misalignment between the pair of wafers, the method 200 processes to operation 230, in which the translational misalignment and the rotational misalignment between the pair of wafers can be compared with predetermined threshold values. If the translational misalignment and the rotational misalignment between the pair of wafers are less than or equal to the predetermined threshold values ("Yes" at 230), it can be determined that the translational misalignment and the rotational misalignment between the pair of wafers are within an allowable error range.

For example, each of the misalignment ΔX1 between the first bonding alignment mark pair 510T and 510B in the first direction (e.g., x-direction), the misalignment ΔY1 between the first bonding alignment mark pair 510T and 510B in the second direction (e.g., y-direction), and the misalignment ΔY2 between the second bonding alignment mark pair 520T and 520B in the second direction (e.g., y-direction) can be compared with a predetermined threshold value, such as a value within a range between 200 nm and 1000 nm. If all of the three misalignment values ΔX1, ΔY1 and ΔY2 are less than the predetermined threshold value, it can be determined that the translational misalignment and the rotational misalignment between the pair of wafers is within the allowable error range. It is noted that, in some other embodiments, the three misalignment values ΔX1, ΔY1 and ΔY2 can be compared with different predetermined threshold values.

If the translational misalignment and the rotational misalignment between the pair of wafers are larger than the predetermined threshold values ("No" at 230), it can be determined that the translational misalignment and the rotational misalignment between the pair of wafers are not within (i.e., "outside of") an allowable error range. In such case, the method 200 processes to operation 240, in which a translational compensation and a rotational compensation can be made during bonding of a new pair of wafers.

In some embodiments, the translational compensation and a rotational compensation can be calculated based on the analyzed translational misalignment and the rotational misalignment at operation 220. For example, according to the misalignment ΔX1 between the first bonding alignment mark pair 510T and 510B in the first direction (e.g., x-direction), the misalignment ΔY1 between the first bonding alignment mark pair 510T and 510B in the second direction (e.g., y-direction), and the misalignment ΔY2 between the second bonding alignment mark pair 520T and 520B in the second direction (e.g., y-direction), a translational displacement and a rotational displacement of the first support for supporting the bottom wafer, and/or the second support for supporting the top wafer can be calculated. In some embodiments, the position and direction of the second support is fixed, so the displacement of the first support in both x-direction and y-direction, as well as the rotational angle of the first support can be calculated based on the three misalignment values ΔX1, ΔY1 and ΔY2.

As such, when bonding the new wafer pair, the position and direction of the first support (and/or the second support) can be adjusted to compensate the analyzed translational misalignment and the rotational misalignment. For example, the wafer position adjustment module of the wafer bonding system can adjust the position and direction of the first support (and/or the second support) based on the calculated translational displacement and rotational displacement to compensate the translational misalignment and the rotational misalignment. After bonding the new wafer pair, the method 200 can go back to operations 220 and 230, in which the translational misalignment and the rotational misalignment between the new pair of wafers can be analyzed and evaluated.

Figure 6:
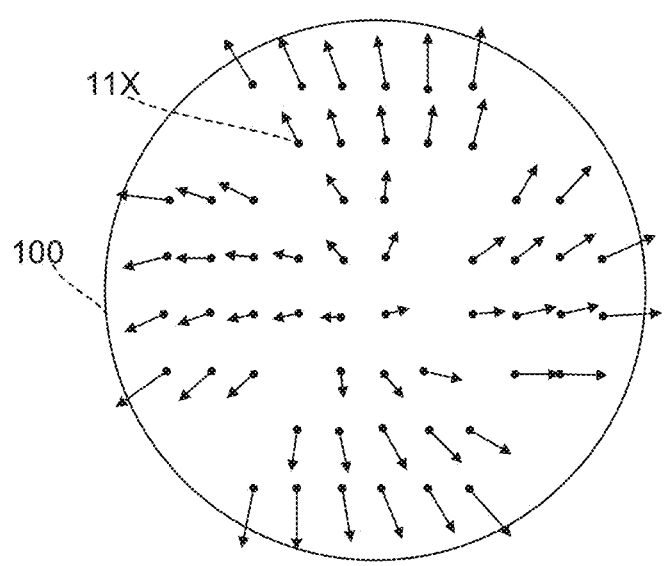
FIG. 6 illustrates a top view of an exemplary wafer misalignment including run-out misalignment, according to some embodiments of the present disclosure.

After being determined that the translational misalignment and the rotational misalignment between the pair of wafers are within the allowable error range ("Yes" at 230), the method 200 can process to operation 250, in which a run-out misalignment (e.g., expansion misalignment) of the pair of wafers can be analyzed. FIG. 6 illustrates a top view of an exemplary wafer misalignment including run-out misalignment. Similarly, the misalignment 11X of each pair of bonding alignment marks on the bonded wafer pair 100 is indicated by a dot representing a location of one bonding alignment mark and an arrow representing a displacement between the location of one bonding alignment mark and a location of the corresponding bonding alignment mark in the mark.

Figure 7:
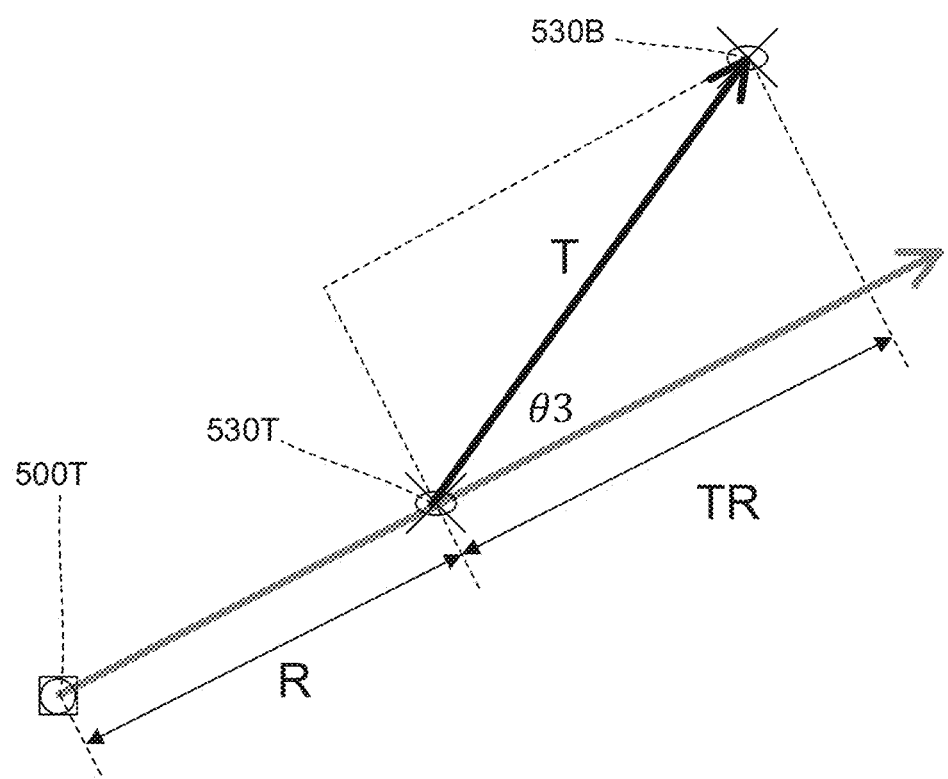
FIG. 7 illustrates a schematic diagram of exemplary bonding alignment mark analyses for run-out misalignment, according to some embodiments of the present disclosure.

FIG. 7 illustrates a schematic diagram of exemplary mark analyses for run-out misalignment in accordance with some embodiments of the present disclosure. In some embodiments, a radial component of the run-out misalignment calculated based on a bonding alignment mark pair may gradually increase with the radius from the bonding alignment mark pair to the wafer center. As such, assuming the deformation of the wafers is uniform, the radial component of the run-out misalignment calculated based on a bonding alignment mark pair is subsequently equal to a millionth of the radius from the bonding alignment mark pair to the wafer center.

As shown in FIG. 7, a distance between the center of the top wafer 500T and a top bonding alignment mark 530T is R. A distance between the top bonding alignment mark 530T and the bottom bonding alignment mark 530B in the pair is T. A projected distance TR of distance T on the radiation direction of the top bonding alignment mark 530T on the top wafer can be T×Cos θ3, where θ3 is the angle between the connection line of the bonding alignment mark pair 530T and 530B and the radiation direction of the top bonding alignment mark 530T on the top wafer. The run-out misalignment ratio ΔR of the bonding alignment mark pair 530T and 530B can be equal to parts per million (PPM) of a ratio of the projected distance TR and the distance R. That is, $\Delta R = T \times \cos\theta 3 \times 10^6 / R$.

In some embodiments, multiple misalignments 11X of bonding alignment mark pairs on the bonded wafer pair 100 can be measured to calculate the run-out misalignment between the pair of wafers. For example, an average of the run-out misalignment ratios of multiple bonding alignment mark pairs can be calculated as a mean run-out misalignment ratio between the pair of wafers. That is, $\overline{\Delta R} = \Sigma_n \Delta R_n / n$, where n is the number of bonding alignment mark pairs used for calculating the mean run-out misalignment ratio $\overline{\Delta R}$. Then, the average of the run-out misalignments of multiple bonding alignment mark pairs can be calculated as a mean run-out misalignment between the pair of wafers, which can be $\overline{\Delta R} \times R$.

It is noted that, assuming the translational misalignment and the rotational misalignment have been compensated, the center of the top wafer 500T and the center of the bottom wafer 500B is overlapped with each other. It is also noted that, the run-out misalignment is calculated based on the top wafer as shown in FIG. 7. However, the run-out misalignment can also be calculated based on the bottom wafer. In doing so, the value of the mean run-out misalignment can be $-\overline{\Delta R} \times R$.

Referring back to FIG. 2, after analyzing the run-out misalignment between the pair of wafers, the method 200 processes to operation 260, in which run-out misalignment between the pair of wafers can be compared with a predetermined threshold value. If the run-out misalignment between the pair of wafers is less than or equal to the predetermined threshold value ("Yes" at 260), it can be determined that run-out misalignment between the pair of wafers are within an allowable error range. For example, the mean run-out misalignment ratio $\overline{\Delta R}$ of the pair of wafers can be compared with a predetermined threshold value, such as a value within a range between 0.4 PPM and 1 PPM. If the mean run-out misalignment ratio ΔR is less than the predetermined threshold value, it can be determined that the run-out misalignment between the pair of wafers is within the allowable error range.

If the run-out misalignment between the pair of wafers are larger than the predetermined threshold values ("No" at 260), it can be determined that the run-out misalignment between the pair of wafers are not within an allowable error range. In such case, the method 200 can process to operation 270, in which a run-out compensation can be made during a bonding of a new pair of wafers.

In some embodiments, the mean run-out misalignment ratio $\overline{\Delta R}$ can determine an expansion rate of the top wafer or the bottom wafer to compensate the run-out misalignment between the pair of wafers. For example, if the mean run-out misalignment ratio $\overline{\Delta R}$ is positive, it can be determined that the top wafer should be expended to compensate the run-out misalignment. If the mean run-out misalignment ratio $\overline{\Delta R}$ is negative, it can be determined that the bottom wafer should be expended to compensate the run-out misalignment. Accordingly, when bonding the new wafer pair, the deformation of the top wafer or the bottom wafer can be controlled to compensate the run-out misalignment of the pair of wafers. After bonding the new wafer pair, the method 200 can go back to operations 250 and 260, in which the run-out misalignment between the new pair of wafers can be analyzed and evaluated.

After being determined that the run-out misalignment between the pair of wafers are within the allowable error range ("Yes" at 230), the method 200 for wafer bonding alignment compensation can end. That is, all of the translational misalignment, the rotational misalignment, and the run-out misalignment are within the predestined allowable error range. As such, a batch of wafer pairs can be bonded subsequently based on the parameters determined by the wafer bonding alignment compensation method 200.

It should be noted that the above steps of the flow diagrams of FIGS. 2 and 4 can be executed or performed in any order or sequence not limited to the order and sequence shown and described in the figure. Also, some of the above steps of the flow diagrams of FIGS. 2 and 4 can be executed or performed substantially simultaneously where appropriate or in parallel to reduce latency and processing times. Furthermore, it should be noted that FIGS. 2 and 4 are provided as examples only. At least some of the steps shown in the figures may be performed in a different order than represented, performed concurrently, or altogether omitted.

For example, in some embodiments, the operations 220 and 250 can be performed substantially simultaneously to analyze the translational misalignment, the rotational misalignment, and the run-out misalignment for a single wafer pair. And in some embodiments, the operations 230 and 260 can be performed substantially simultaneously to determine whether the translational misalignment, the rotational misalignment, and the run-out misalignment are within the allowable error range. In doing so, the operations 240 and 270 can be performed substantially simultaneously to compensate the translational misalignment, the rotational misalignment, and the run-out misalignment during bonding one pair of wafers.

Figure 8:
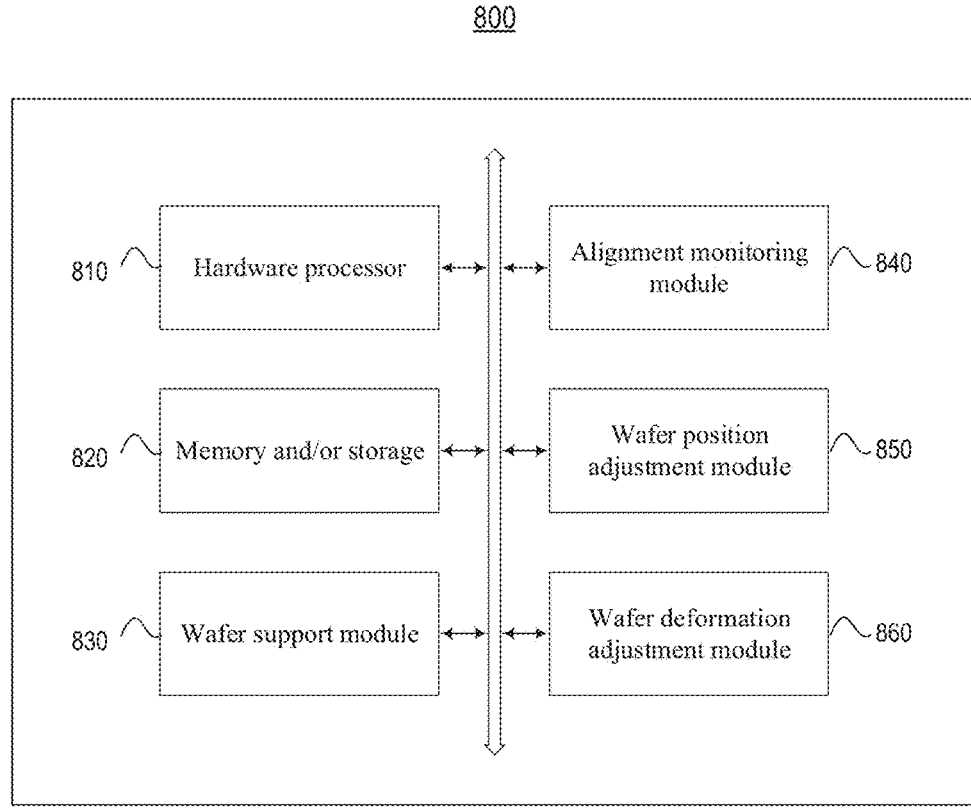
FIG. 8 illustrates a schematic diagram of an exemplary wafer bonding system, according to some embodiments of the present disclosure.

Referring to FIG. 8, a schematic structural diagram of an exemplary wafer bonding system 800 is illustrated in accordance with some embodiments of the disclosure. As shown in FIG. 8, the wafer bonding system 800 can include a hardware processor 810, a memory and/or storage 820, a wafer support module 830, an alignment monitoring module 840, a wafer position adjustment module 850, and a wafer deformation adjustment module 860. In some embodiments, the wafer bonding system 800 can further include a bus for communicating components of the wafer bonding system 800, a communication interface for input/output information, a power system for supplying power of the wafer bonding system 800, and/or any other suitable components.

The hardware processor 810 can include any suitable hardware processor, such as a microprocessor, a microcontroller, a central processing unit (CPU), a network processor (NP), a digital signal processor (DSP), an application specific integrated circuit (ASIC), a field-programmable gate array (FPGA), or another programmable logic device, discrete gate or transistor logic device, discrete hardware component. The hardware processor 810 is configured to implement or execute part or all of the methods consistent with the disclosure, such as one of the exemplary methods for wafer bonding alignment compensation described above.

The memory and/or storage 820 can be any suitable memory and/or storage for storing programs, data, instructions, and/or any other suitable content in some embodiments. For example, the memory and/or storage 820 can include a random access memory (RAM), read only memory, flash memory, non-volatile memory, such as hard disk storage, optical media, and/or any other suitable storage device. In some embodiments, the memory and/or storage 820 includes a non-transitory computer-readable storage medium storing instructions that, when executed by the hardware processor 810, cause the hardware processor 810 to perform the methods consistent with the disclosure, such as one of the exemplary methods for wafer bonding alignment compensation described above.

The wafer support module 830 can include a first support and a second support for supporting a bottom wafer and a top wafer respectively. Each of the first support and the second support can include a stage having an aperture, and a chuck mounted on or attached to the aperture of the stage. In some embodiments, the chuck can be substantially transparent. For example, the chuck may comprise glass, quartz, or other type of transparent materials. In other embodiments, the chuck may comprise a translucent or opaque material.

The alignment monitoring module 840 can include any suitable optical equipment for monitoring bonding alignment marks on the bottom wafer and/or the top wafer, and detecting the positions of the bonding alignment marks. For example, the alignment monitoring module can include one or more infrared (IR) charge coupled device (CCD) scopes comprising an IR live CCD configured to emit reflective infrared (RIR) or transparent infrared (TIR) energy. In some embodiments, the alignment monitoring module 840 can further include any suitable optical equipment for positioning the bonding alignment marks, such as a linear variable differential transformer (LVDT), a laser interferometer, or an optical linear encoder and decoder, etc.

The wafer position adjustment module 850 can be controlled by the hardware processor 810 to adjust the positions of the wafer support module 830. In some embodiments, the wafer position adjustment module 850 can include any suitable equipment coupled with the first support and/or the second support, such as a piezoelectric motor, a linear motor, etc. The wafer position adjustment module 850 can be configured to adjust linear positions (e.g., x-coordinate position, y-coordinate position, and z-coordinate position), and/or an angular position of the bottom wafer and/or the top wafer by controlling the movement of the first support and/or the second support.

The wafer deformation adjustment module 860 can be controlled by the hardware processor 810 to adjust the deformation of the bottom wafer and/or the top wafer. In some embodiments, wafer deformation adjustment module 860 includes a plurality of suction holes and vent holes on the chucks of the wafer support module 830. The plurality of suction holes and vent holes can be controlled by the hardware processor 810 to adjust the pressure between the bottom/top wafer and the corresponding chuck during the bonding process.

In some embodiments, the process of the disclosed methods in various embodiments can be directly executed by a hardware decoding processor, or by a decoding processor including a hardware module and a software module. The software module may reside in any suitable storage/memory medium, such as a random access memory, a flash memory, a read-only memory, a programmable read-only memory, an electrically erasable programmable memory, a register, etc. The storage medium can be located in the memory and/or storage 820. The hardware processor 810 can implement the processes of the disclosed method by using the hardware and the information read from the memory and/or storage 820.

The flowcharts and blocks in the figures may illustrate various embodiments of the disclosed methods and systems, as well as architectures, functions and operations that can be fully or partially implemented by a computer program product. In this case, each block of the flowcharts or block diagrams may represent a module, a code segment, a portion of program code. Each module, each code segment, and each portion of program code may include one or more executable instructions for implementing predetermined logical functions. It is also noted that, each block in the block diagrams and/or flowcharts, as well as the combinations of the blocks in the block diagrams and/or flowcharts, can be realized by a dedicated hardware-based system for executing specific functions, or can be realized by a dedicated system including hardware and computer instructions.

Accordingly, methods and systems for wafer bonding alignment compensation are provided.

Disclosed is a method for wafer bonding alignment compensation. The method comprises bonding a first pair of wafers including a plurality of bonding alignment mark pairs on the first pair of wafers, wherein each wafer has a corresponding bonding alignment mark from each of the plurality of bonding alignment mark pairs; first analyzing a translational misalignment and a rotational misalignment between the first pair of wafers based on a measurement of at least two bonding alignment mark pairs; controlling a wafer position adjustment module to compensate for the translational misalignment and the rotational misalignment during bonding of a second pair of wafers based on the first analysis; second analyzing a mean run-out misalignment between the first pair of wafers based on a measurement of the plurality of bonding alignment mark pairs; and controlling a wafer deformation adjustment module to compensate for the run-out misalignment during bonding of a third pair of wafers based on the second analysis.

In some embodiments, the method further comprises: determining whether the translational misalignment and the rotational misalignment are within an allowable error range; and in response to determining that the translational misalignment and the rotational misalignment are outside the allowable error range, controlling the wafer position adjustment module to compensate the translational misalignment and the rotational misalignment during bonding of the second pair of wafers.

In some embodiments, the method further comprises: determining whether the run-out misalignment is within an allowable error range; and in response to determining that the run-out misalignment is outside the allowable error range, controlling the wafer deformation adjustment module to compensate the run-out misalignment during bonding of the third pair of wafers.

In some embodiments, the first pair of wafers including a bottom wafer and a top wafer; and each bonding alignment mark pair includes a bottom bonding alignment mark on the bottom wafer and a top bonding alignment mark on the top wafer.

In some embodiments, first analyzing the translational misalignment and the rotational misalignment between the first pair of wafers comprises: calculating a first misalignment between a first bonding alignment mark pair in a first direction; calculating a second misalignment between the first bonding alignment mark pair in a second direction; and calculating a third misalignment between a second bonding alignment mark pair in the second direction.

In some embodiments, calculating the first misalignment between the first bonding alignment mark pair in the first direction comprises: determining a first distance between a center of the top wafer and a center of the bottom wafer in the first direction; determining a second distance between the bottom bonding alignment mark of the first bonding alignment mark pair and the center of bottom wafer; determining an angle between the first direction and a connection line of the bottom bonding alignment mark of the first bonding alignment mark pair and the center of bottom wafer; and calculating the first misalignment between the first bonding alignment mark pair in the first direction based on the first distance, the second distance, and the angle.

In some embodiments, calculating the second misalignment between the first bonding alignment mark pair in the second direction comprises: determining a first distance between a center of the top wafer and a center of the bottom wafer in the second direction; determining a second distance between the bottom bonding alignment mark of the first bonding alignment mark pair and the center of bottom wafer; determining an angle between the first direction and a connection line of the bottom bonding alignment mark of the first bonding alignment mark pair and the center of bottom wafer; and calculating the second misalignment between the first bonding alignment mark pair in the second direction based on the first distance, the second distance, and the angle.

In some embodiments, calculating the third misalignment between the second bonding alignment mark pair in the second direction comprises: determining a first distance between a center of the top wafer and a center of the bottom wafer in the second direction; determining a second distance between the bottom bonding alignment mark of the second bonding alignment mark pair and the center of bottom wafer; determining an angle between the first direction and a connection line of the bottom bonding alignment mark of the second bonding alignment mark pair and the center of bottom wafer; and calculating the third misalignment between the second bonding alignment mark pair in the second direction based on the first distance, the second distance, and the angle.

In some embodiments, controlling the wafer position adjustment module to compensate for translational misalignment and the rotational misalignment during bonding of the second pair of wafers based on the first analysis comprises: adjusting a position of at least one of the second pair of wafers based on the first misalignment, the second misalignment, and the third misalignment.

In some embodiments, second analyzing the mean run-out misalignment between the first pair of wafers comprises: calculating a run-out misalignment between each bonding alignment mark pair; and calculating an average of the run-out misalignments corresponding to the plurality of bonding alignment mark pairs as the mean run-out misalignment between the pair of wafers.

In some embodiments, calculating the run-out misalignment between each bonding alignment mark pair comprises: determining a first distance between a center of the top wafer and a top bonding alignment mark in a bonding alignment mark pair; determining a second distance between the top bonding alignment mark and a bottom bonding alignment mark in the bonding alignment mark pair; determining an angle between a connection line of the bonding alignment mark pair and a radiation direction of the top bonding alignment mark on the top wafer; and calculating the run-out misalignment between the bonding alignment mark pair based on the first distance, the second distance, and the angle.

In some embodiments, controlling the wafer deformation adjustment module to compensate the run-out misalignment during bonding of the third pair of wafers based on the second analysis comprises: adjusting a deformation of at least one of the third pair of wafers based on the mean run-out misalignment.

Another aspect of the present disclosure provides a system for bonding wafers. The system comprises: a wafer support module configured to support a first pair of wafers including a plurality of bonding alignment mark pairs, wherein the first pair of wafers including a bottom wafer and a top wafer, and each bonding alignment mark pair includes a bottom bonding alignment mark on the bottom wafer and a top bonding alignment mark on the top wafer; an alignment monitoring module configured to measure positions of the plurality of bonding alignment mark pairs; a hardware processor configured to analyze a translational misalignment and a rotational misalignment between the first pair of wafers based on a measurement of at least two bonding alignment mark pairs, and to analyze a mean run-out misalignment between the first pair of wafers based on a measurement of the plurality of bonding alignment mark pairs; a wafer position adjustment module configured to compensate the translational misalignment and the rotational misalignment during bonding of a second pair of wafers; and a wafer deformation adjustment module configured to compensate the mean run-out misalignment during bonding of a third pair of wafers.

In some embodiments, the hardware processor further is configured to: determine whether the translational misalignment and the rotational misalignment are within an allowable error range; and in response to determining that the translational misalignment and the rotational misalignment are outside the allowable error range, control the wafer position adjustment module to compensate the translational misalignment and the rotational misalignment during bonding the second pair of wafers.

In some embodiments, the hardware processor further is configured to: determine whether the run-out misalignment is within an allowable error range; and in response to determining that the run-out misalignment is outside the allowable error range, control the wafer deformation adjustment module to compensate the run-out misalignment during bonding of the third pair of wafers.

In some embodiments, the hardware processor further is configured to: calculate a first misalignment between a first bonding alignment mark pair in a first direction; calculate a second misalignment between the first bonding alignment mark pair in a second direction; and calculate a third misalignment between a second bonding alignment mark pair in the second direction.

In some embodiments, the hardware processor further is configured to: determine a first distance between a center of the top wafer and a center of the bottom wafer in the first direction; determine a second distance between the bottom bonding alignment mark of the first bonding alignment mark pair and the center of bottom wafer; determine an angle between the first direction and a connection line of the bottom bonding alignment mark of the first bonding alignment mark pair and the center of bottom wafer; and calculate the first misalignment between the first bonding alignment mark pair in the first direction based on the first distance, the second distance, and the angle.

In some embodiments, the hardware processor further is configured to: determine a first distance between a center of the top wafer and a center of the bottom wafer in the second direction; determine a second distance between the bottom bonding alignment mark of the first bonding alignment mark pair and the center of bottom wafer; determine an angle between the first direction and a connection line of the bottom bonding alignment mark of the first bonding alignment mark pair and the center of bottom wafer; and calculate the second misalignment between the first bonding alignment mark pair in the second direction based on the first distance, the second distance, and the angle.

In some embodiments, the hardware processor further is configured to: determine a first distance between a center of the top wafer and a center of the bottom wafer in the second direction; determine a second distance between the bottom bonding alignment mark of the second bonding alignment mark pair and the center of bottom wafer; determine an angle between the first direction and a connection line of the bottom bonding alignment mark of the second bonding alignment mark pair and the center of bottom wafer; and calculate the third misalignment between the second bonding alignment mark pair in the second direction based on the first distance, the second distance, and the angle.

In some embodiments, the hardware processor further is configured to: control the wafer position adjustment module to adjust a position of at least one of the second pair of wafers based on the first misalignment, second misalignment, and the third misalignment.

In some embodiments, the hardware processor further is configured to: calculate a run-out misalignment between each bonding alignment mark pair; and calculate an average of the run-out misalignments corresponding to the plurality of bonding alignment mark pairs as the mean run-out misalignment between the pair of wafers.

In some embodiments, the hardware processor further is configured to: determine a first distance between a center of the top wafer and a top bonding alignment mark in a bonding alignment mark pair; determine a second distance between the top bonding alignment mark and a bottom bonding alignment mark in the bonding alignment mark pair; determine an angle between a connection line of the bonding alignment mark pair and a radiation direction of the top bonding alignment mark on the top wafer; and calculate the run-out misalignment between the bonding alignment mark pair based on the first distance, the second distance, and the angle.

In some embodiments, the hardware processor further is configured to: control the wafer deformation adjustment module to adjust a deformation of at least one of the third pair of wafers based on the mean run-out misalignment.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for wafer bonding alignment compensation, comprising:
   bonding a first pair of wafers including a bottom wafer and a top wafer, wherein a plurality of bonding alignment mark pairs are on the first pair of wafers, each bonding alignment mark pair includes a bottom bonding alignment mark on the bottom wafer and a top bonding alignment mark on the top wafer;
   first analyzing a translational misalignment and a rotational misalignment between the first pair of wafers based on a measurement of at least two bonding alignment mark pairs;
   controlling a wafer position adjustment module to compensate for the translational misalignment and the rotational misalignment during bonding of a second pair of wafers based on the first analysis;
   second analyzing a mean run-out misalignment between the first pair of wafers based on a measurement of the plurality of bonding alignment mark pairs; and
   controlling a wafer deformation adjustment module to compensate for the run-out misalignment during bonding of a third pair of wafers based on the second analysis.

2. The method of claim 1, further comprising:
   determining whether the translational misalignment and the rotational misalignment are within an allowable error range;
   in response to determining that the translational misalignment and the rotational misalignment are outside the allowable error range, controlling the wafer position adjustment module to compensate the translational misalignment and the rotational misalignment during bonding of the second pair of wafers;
   determining whether the run-out misalignment is within an allowable error range; and
   in response to determining that the run-out misalignment is outside the allowable error range, controlling the wafer deformation adjustment module to compensate the run-out misalignment during bonding of the third pair of wafers.

3. The method of claim 1, wherein first analyzing the translational misalignment and the rotational misalignment between the first pair of wafers comprises:
   calculating a first misalignment between a first bonding alignment mark pair in a first direction;
   calculating a second misalignment between the first bonding alignment mark pair in a second direction; and
   calculating a third misalignment between a second bonding alignment mark pair in the second direction.

4. The method of claim 3, wherein calculating the first misalignment between the first bonding alignment mark pair in the first direction comprises:
   determining a first distance between a center of the top wafer and a center of the bottom wafer in the first direction;
   determining a second distance between the bottom bonding alignment mark of the first bonding alignment mark pair and the center of bottom wafer;
   determining an angle between the first direction and a connection line of the bottom bonding alignment mark of the first bonding alignment mark pair and the center of bottom wafer; and calculating the first misalignment between the first bonding alignment mark pair in the first direction based on the first distance, the second distance, and the angle.

5. The method of claim 3, wherein calculating the second misalignment between the first bonding alignment mark pair in the second direction comprises:
   determining a first distance between a center of the top wafer and a center of the bottom wafer in the second direction;
   determining a second distance between the bottom bonding alignment mark of the first bonding alignment mark pair and the center of bottom wafer;
   determining an angle between the first direction and a connection line of the bottom bonding alignment mark of the first bonding alignment mark pair and the center of bottom wafer; and
   calculating the second misalignment between the first bonding alignment mark pair in the second direction based on the first distance, the second distance, and the angle.

6. The method of claim 3, wherein calculating the third misalignment between the second bonding alignment mark pair in the second direction comprises:
   determining a first distance between a center of the top wafer and a center of the bottom wafer in the second direction;
   determining a second distance between the bottom bonding alignment mark of the second bonding alignment mark pair and the center of bottom wafer;
   determining an angle between the first direction and a connection line of the bottom bonding alignment mark of the second bonding alignment mark pair and the center of bottom wafer; and
   calculating the third misalignment between the second bonding alignment mark pair in the second direction based on the first distance, the second distance, and the angle.

7. The method of claim 3, wherein controlling the wafer position adjustment module to compensate for translational misalignment and the rotational misalignment during bonding of the second pair of wafers based on the first analysis comprises:
   adjusting a position of at least one of the second pair of wafers based on the first misalignment, the second misalignment, and the third misalignment.

8. The method of claim 1, wherein second analyzing the mean run-out misalignment between the first pair of wafers comprises:
   calculating a run-out misalignment between each bonding alignment mark pair; and
   calculating an average of the run-out misalignments corresponding to the plurality of bonding alignment mark pairs as the mean run-out misalignment between the pair of wafers.

9. The method of claim 8, wherein calculating the run-out misalignment between each bonding alignment mark pair comprises:
   determining a first distance between a center of the top wafer and a top bonding alignment mark in a bonding alignment mark pair;
   determining a second distance between the top bonding alignment mark and a bottom bonding alignment mark in the bonding alignment mark pair;
   determining an angle between a connection line of the bonding alignment mark pair and a radiation direction of the top bonding alignment mark on the top wafer; and
   calculating the run-out misalignment between the bonding alignment mark pair based on the first distance, the second distance, and the angle.

10. The method of claim 1, wherein controlling the wafer deformation adjustment module to compensate the run-out misalignment during bonding of the third pair of wafers based on the second analysis comprises:
    adjusting a deformation of at least one of the third pair of wafers based on the mean run-out misalignment.

11. A system for bonding wafers, comprising:
    a wafer support module configured to support a first pair of wafers including a plurality of bonding alignment mark pairs, wherein the first pair of wafers including a bottom wafer and a top wafer, and each bonding alignment mark pair includes a bottom bonding alignment mark on the bottom wafer and a top bonding alignment mark on the top wafer;
    an alignment monitoring module configured to measure positions of the plurality of bonding alignment mark pairs;
    a hardware processor configured to analyze a translational misalignment and a rotational misalignment between the first pair of wafers based on a measurement of at least two bonding alignment mark pairs, and to analyze a mean run-out misalignment between the first pair of wafers based on a measurement of the plurality of bonding alignment mark pairs;
    a wafer position adjustment module configured to compensate the translational misalignment and the rotational misalignment during bonding of a second pair of wafers; and
    a wafer deformation adjustment module configured to compensate the mean run-out misalignment during bonding of a third pair of wafers.

12. The system of claim 11, wherein the hardware processor further configured to:
    determine whether the translational misalignment and the rotational misalignment are within an allowable error range;
    in response to determining that the translational misalignment and the rotational misalignment are outside the allowable error range, control the wafer position adjustment module to compensate the translational misalignment and the rotational misalignment during bonding the second pair of wafers;
    determine whether the run-out misalignment is within an allowable error range; and
    in response to determining that the run-out misalignment is outside the allowable error range, control the wafer deformation adjustment module to compensate the run-out misalignment during bonding of the third pair of wafers.

13. The system of claim 11, wherein the hardware processor further configured to:
    calculate a first misalignment between a first bonding alignment mark pair in a first direction;
    calculate a second misalignment between the first bonding alignment mark pair in a second direction; and
    calculate a third misalignment between a second bonding alignment mark pair in the second direction.

14. The system of claim 13, wherein the hardware processor further configured to:
    determine a first distance between a center of the top wafer and a center of the bottom wafer in the first direction;

determine a second distance between the bottom bonding alignment mark of the first bonding alignment mark pair and the center of bottom wafer;

determine an angle between the first direction and a connection line of the bottom bonding alignment mark of the first bonding alignment mark pair and the center of bottom wafer; and calculate the first misalignment between the first bonding alignment mark pair in the first direction based on the first distance, the second distance, and the angle.

15. The system of claim 13, wherein the hardware processor further configured to:

determine a first distance between a center of the top wafer and a center of the bottom wafer in the second direction;

determine a second distance between the bottom bonding alignment mark of the first bonding alignment mark pair and the center of bottom wafer;

determine an angle between the first direction and a connection line of the bottom bonding alignment mark of the first bonding alignment mark pair and the center of bottom wafer; and calculate the second misalignment between the first bonding alignment mark pair in the second direction based on the first distance, the second distance, and the angle.

16. The system of claim 13, wherein the hardware processor further configured to:

determine a first distance between a center of the top wafer and a center of the bottom wafer in the second direction;

determine a second distance between the bottom bonding alignment mark of the second bonding alignment mark pair and the center of bottom wafer;

determine an angle between the first direction and a connection line of the bottom bonding alignment mark of the second bonding alignment mark pair and the center of bottom wafer; and calculate the third misalignment between the second bonding alignment mark pair in the second direction based on the first distance, the second distance, and the angle.

17. The system of claim 13, wherein the hardware processor further configured to:

control the wafer position adjustment module to adjust a position of at least one of the second pair of wafers based on the first misalignment, second misalignment, and the third misalignment.

18. The system of claim 11, wherein the hardware processor further configured to:

calculate a run-out misalignment between each bonding alignment mark pair; and calculate an average of the run-out misalignments corresponding to the plurality of bonding alignment mark pairs as the mean run-out misalignment between the pair of wafers.

19. The system of claim 18, wherein the hardware processor further configured to:

determine a first distance between a center of the top wafer and a top bonding alignment mark in a bonding alignment mark pair;

determine a second distance between the top bonding alignment mark and a bottom bonding alignment mark in the bonding alignment mark pair;

determine an angle between a connection line of the bonding alignment mark pair and a radiation direction of the top bonding alignment mark on the top wafer; and calculate the run-out misalignment between the bonding alignment mark pair based on the first distance, the second distance, and the angle.

20. The system of claim 11, wherein the hardware processor further configured to:

control the wafer deformation adjustment module to adjust a deformation of at least one of the third pair of wafers based on the mean run-out misalignment.

* * * * *